United States Patent
Byun et al.

(10) Patent No.: US 7,523,543 B2
(45) Date of Patent: Apr. 28, 2009

(54) METHODS OF FORMING MAGNETIC MEMORY DEVICES INCLUDING FERROMAGNETIC SPACERS

(75) Inventors: Kyung-Rae Byun, Gyeonggi-do (KR); Sung-Lae Cho, Gyeonggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 11/776,625

(22) Filed: Jul. 12, 2007

(65) Prior Publication Data

US 2008/0016675 A1 Jan. 24, 2008

Related U.S. Application Data

(63) Continuation of application No. 11/093,206, filed on Mar. 29, 2005, now abandoned.

(30) Foreign Application Priority Data

Jul. 29, 2004 (KR) .............................. 2004-59812

(51) Int. Cl.
*G11B 5/127* (2006.01)
*H04R 31/00* (2006.01)
(52) U.S. Cl. .............. 29/603.16; 29/603.13; 29/603.14; 29/603.15; 29/603.18; 205/62; 205/66; 360/121; 360/122; 360/317; 451/5; 451/41
(58) Field of Classification Search . 29/603.13–603.16, 29/603.18; 360/122, 126, 317; 365/158; 205/62, 66; 451/5, 41
See application file for complete search history.

(56) References Cited

U.S. PATENT DOCUMENTS 6,130,814 A  10/2000  Sun (Continued)

FOREIGN PATENT DOCUMENTS

JP  2001-084757  3/2001

(Continued)

OTHER PUBLICATIONS

Boeck et al. "Spintronics, a New Nanoelectronics Adventure" thinfilmmfg.com 5 pages (2002) <http://www.thinfilmmfg.com/subscribers/Subscriber02/spin1May02.htm> Accessed online on May 20, 2005.

(Continued)

*Primary Examiner*—Paul D Kim
(74) *Attorney, Agent, or Firm*—Myers Bigel Sibley & Sajovec, P.A.

(57) ABSTRACT

A magnetic memory device may include a digit line on a substrate, a first insulating layer on the digit line, and a magnetic tunnel junction memory cell on the first insulating layer so that the first insulating layer is between the digit line and the magnetic tunnel junction memory cell. A second insulating layer may be provided on the magnetic tunnel junction memory cell, wherein the second insulating layer has a hole therein exposing portions of the magnetic tunnel junction memory cell. A bit line may be provided on the second insulating layer and on portions of the magnetic tunnel junction memory cell exposed by the hole in the second insulating layer, and ferromagnetic spacers may be provided on sidewalls of at least one of the digit line and/or the bit line. Related methods are also discussed.

14 Claims, 10 Drawing Sheets

U.S. PATENT DOCUMENTS

| | | | |
|---|---|---|---|
| 6,163,477 | A | 12/2000 | Tran |
| 6,385,082 | B1 | 5/2002 | Abraham et al. |
| 6,385,083 | B1 | 5/2002 | Sharma et al. |
| 6,413,788 | B1 | 7/2002 | Tuttle |
| 6,430,085 | B1 | 8/2002 | Rizzo |
| 6,509,621 | B2 | 1/2003 | Nakao |
| 6,545,906 | B1 | 4/2003 | Savtchenko et al. |
| 6,548,849 | B1 | 4/2003 | Pan et al. |
| 6,555,858 | B1 | 4/2003 | Jones et al. |
| 6,556,473 | B2 | 4/2003 | Saito et al. |
| 6,560,135 | B2 | 5/2003 | Matsuoka et al. |
| 6,603,677 | B2 | 8/2003 | Redon et al. |
| 6,603,678 | B2 | 8/2003 | Nickel et al. |
| 6,720,597 | B2 | 4/2004 | Janesky et al. |
| 6,724,674 | B2 | 4/2004 | Abraham et al. |
| 6,737,691 | B2 | 5/2004 | Asao |
| 6,744,651 | B2 | 6/2004 | Tang |
| 6,762,953 | B2 | 7/2004 | Tanizaki et al. |
| 6,771,534 | B2 | 8/2004 | Stipe |
| 6,791,874 | B2 | 9/2004 | Tran et al. |
| 6,794,696 | B2 | 9/2004 | Fukuzumi |
| 2002/0176277 | A1 | 11/2002 | Bessho et al. |
| 2003/0161181 | A1 | 8/2003 | Saito et al. |
| 2003/0170976 | A1 | 9/2003 | Molla et al. |
| 2004/0021189 | A1 | 2/2004 | Yoda et al. |
| 2004/0075125 | A1* | 4/2004 | Asao .................... 257/295 |
| 2004/0152227 | A1 | 8/2004 | Yoda et al. |
| 2005/0024930 | A1 | 2/2005 | Yoda et al. |
| 2005/0078510 | A1 | 4/2005 | Jeong et al. |
| 2005/0169044 | A1 | 8/2005 | Hosotani |
| 2005/0275000 | A1 | 12/2005 | Kajiyama et al. |

FOREIGN PATENT DOCUMENTS

| | | |
|---|---|---|
| JP | 2001-250206 | 9/2001 |
| JP | 2002-319664 | 10/2002 |
| KR | 1020020046036 | 6/2002 |
| KR | 1020030040027 | 5/2003 |
| KR | 1020030051369 | 6/2003 |
| KR | 10-2003-0062280 | 7/2003 |
| KR | 1020030062280 | 7/2003 |
| KR | 1020030066393 | 8/2003 |
| KR | 1020030084951 | 11/2003 |
| KR | 1020040003479 | 1/2004 |
| KR | 1020040011390 | 2/2004 |
| KR | 1020040026619 | 3/2004 |
| KR | 1020040038420 | 5/2004 |
| KR | 1020040075229 | 8/2004 |
| KR | 1020050077157 | 8/2005 |
| KR | 1020050080941 | 8/2005 |
| KR | 1020050093529 | 9/2005 |
| WO | 2004/049344 | 6/2004 |

OTHER PUBLICATIONS

Deak "Spin Injection in Thermally Assisted Magnetic Random Access Memory" 15 pages <http://www.nve.com/advpdf/49th_MMM_spin_injection_TA_MRAM.pdf> Accessed online on Jun. 20, 2005.

Fert et al. "The New Era of Spintronics" *Europhysics News* 34(6) 7 pages (2003) <http://www.europhysicsnews.com/full/24/article9/article9.html> Accessed online on Jun. 20, 2005.

Johnson "Magnetic Spin Locks data into MRAMs" *EETimes Online* (Jul. 17, 2001) 4 pages <http://www.eetimes.com/story/OEG20010717S0064> Accessed online on Apr. 18, 2005.

Notice to Submit a Response/Amendment to the Examination Report for Korean Patent Application No. 10-2004-0059812 mailed Jan. 18, 2006.

\* cited by examiner

METHODS OF FORMING MAGNETIC MEMORY DEVICES INCLUDING FERROMAGNETIC SPACERS

RELATED APPLICATION

This application claims the benefit of priority as a continuation of U.S. application Ser. No. 11/093,206 filed Mar. 29, 2005, now abandoned which claims the benefit of and priority under 35 U.S.C. Sec. 119 to Korean Application No. 2004-59812 filed on Jul. 29, 2004. The disclosures of both of the above referenced applications are hereby incorporated herein in their entirety by reference.

FIELD OF THE INVENTION

The present invention relates to semiconductor devices, and more particularly to magnetic memory devices and methods for forming the same.

BACKGROUND

A magnetic memory device is a semiconductor device that may perform write and read operations at relatively high speeds and that may provide relatively high integration. In addition, a magnetic memory device may efficiently perform re-write operations and may provide nonvolatile memory storage. Usage of magnetic memory devices is thus increasing.

In general, a magnetic memory device uses a magnetic tunnel junction (MTJ) memory cell as a data storing element. An MTJ memory cell may include two ferromagnetic materials and an insulator positioned between the two ferromagnetic materials. A resistance of an MTJ memory cell may be changed according to magnetization directions of the two ferromagnetic materials. That is, the resistance of the MTJ memory cell may be smaller when the magnetization directions of the two ferromagnetic materials are the same than when the magnetization directions thereof are different. Whether information stored in a memory cell of a magnetic memory device is logic '1' or logic '0' may be determined by sensing a magnitude of current flowing through the MTJ memory cell resulting from variations of the resistance.

A conventional magnetic memory device including a MJT memory cell is schematically shown in FIG. 1. Referring to FIG. 1, the magnetic memory device includes an MTJ memory cell 11, a digit line 1, and a bit line 13. The digit line 1 is disposed below the MTJ memory cell 11 with a predetermined gap therebetween. The bit line 13 contacts the top surface of the MTJ memory cell 11 and crosses an upper portion of the digit line 1. The MTJ memory cell 11 is disposed at the intersection of the digit line 1 and the bit line 13. The bottom surface of the MTJ memory cell 11 is electrically connected to a switching element (not shown) such as a MOS transistor via an electrode 3.

The MTJ memory cell 11 includes a lower magnetic pattern 5, an insulation pattern 7, and an upper magnetic pattern 9 that are sequentially stacked. A magnetization direction of the lower magnetic pattern 5 is fixed, but a magnetization direction of the upper magnetic pattern 9 is changeable according to an applied magnetic field.

Operations of writing data on the magnetic memory device will now be briefly discussed. A predetermined current is applied to the digit line 1 and the bit line 13, respectively, to form magnetic fields around the digit line 1 and the bit line 13. The vector sum of the magnetic field formed around the digit line 1 and the magnetic field formed around the bit line 13 is applied to the MTJ memory cell 11, thereby changing the magnetization direction of the upper magnetic pattern 9.

With increasing integration densities of semiconductor devices, sizes of MTJ memory cells 11 may be gradually reduced. As the size of an MTJ memory cell 11 decreases, a strength of the magnetic field used to change magnetization directions of the MTJ memory cell 11 increases, thereby increasing an amount of current applied to the digit line 1 and the bit line 13 for the write operation of the magnetic memory device. As a result, power consumption of the magnetic memory device may increase.

SUMMARY OF THE INVENTION

According to embodiments of the present invention, a magnetic memory device may include a digit line on a substrate, a first insulting layer on the digit line, and a magnetic tunnel junction memory cell on the first insulating layer so that the first insulating layer is between the digit line and the magnetic tunnel junction memory cell. A second insulating layer may be provided on the magnetic tunnel junction memory cell, with the second insulating layer having a hole therein exposing portions of the magnetic tunnel junction memory cell. A bit line may be provided on the second insulating layer and on portions of the magnetic tunnel junction memory cell exposed by the hole in the second insulating layer, and ferromagnetic spacers may be provided on sidewalls of at least one of the digit line and/or the bit line.

In addition, a ferromagnetic plate may be provided between the digit line and the substrate, wherein the ferromagnetic spacers are on sidewalls of the digit line and the ferromagnetic plate. The digit line may include a material having an etch selection ratio with respect to the ferromagnetic spacers, and a capping layer may be provided between the digit line and the first insulating layer with sidewalls of the capping layer being aligned with sidewalls of the digit line. Moreover, the ferromagnetic spacers may be on at least portions of sidewalls of the capping layer, and the capping layer may include a material having an etch selection ratio with respect to at least one of the ferromagnetic plate and/or the ferromagnetic spacers.

In addition, a ferromagnetic plate may be provided on the bit line, sidewalls of the ferromagnetic plate may be aligned with sidewalls of the bit line, and the ferromagnetic spacers may be on sidewalls of the bit line and the ferromagnetic plate. Moreover, a capping layer may be provided on the ferromagnetic plate, the ferromagnetic plate may be between the capping layer and the bit line, and sidewalls of the capping layer may be aligned with sidewalls of the bit line. The ferromagnetic spacers may be on at least portions of sidewalls of the capping pattern, and the capping layer may include a material having an etch selection ratio with respect to the ferromagnetic plate and/or the ferromagnetic spacers.

The magnetic memory device may also include first and second ferromagnetic plates. The first ferromagnetic plate may be provided between the digit line and the substrate, and the ferromagnetic spacers may include first ferromagnetic spacers on sidewalls of the digit line and the first ferromagnetic plate. The second ferromagnetic plate may be provided on the bit line, sidewalls of the second ferromagnetic plate may be aligned with sidewalls of the bit line, and the second ferromagnetic spacers may be on sidewalls of the bit line and the second ferromagnetic plate. Moreover, the digit line may include a conductive material having an etch selection ratio with respect to the first ferromagnetic spacers.

In addition, a first capping layer may be provided between the digit line and the first insulating layer, and a second capping layer may be provided on the second ferromagnetic plate between the second capping layer and the bit line. The first capping layer may have sidewalls aligned with sidewalls of the digit line, and the second capping layer may have sidewalls aligned with sidewalls of the bit line. The first ferromagnetic spacers may be provided on at least portions of sidewalls of the first capping layer, and the second ferromagnetic spacers may be provided on at least portions of sidewalls of the second capping layer. Moreover, the first capping layer may include a material having an etch selection ratio with respect to at least one of the first ferromagnetic plate and/or the first ferromagnetic spacers, and the second capping layer may include a material having an etch selection ratio with respect to at least one of the second ferromagnetic plate and/or the second ferromagnetic spacers.

According to additional embodiments of the present invention, methods of forming magnetic memory devices may include forming a digit line on a substrate, forming a first insulting layer on the digit line, and forming a magnetic tunnel junction memory cell on the first insulating layer with the first insulating layer being between the digit line and the magnetic tunnel junction memory cell. A second insulating layer may be formed on the magnetic tunnel junction memory cell, and the second insulating layer may have a hole therein exposing portions of the magnetic tunnel junction memory cell. A bit line may be formed on the second insulating layer and on portions of the magnetic tunnel junction memory cell exposed by the hole in the second insulating layer, and ferromagnetic spacers may be formed on sidewalls of at least one of the digit line and/or the bit line.

In addition, a ferromagnetic plate may be formed between the digit line and the substrate, and forming the ferromagnetic spacers may include, before forming the first insulating layer, forming a conformal ferromagnetic layer on the digit line and the ferromagnetic plate and anisotropic etching the conformal ferromagnetic layer. The digit line may include a conductive material having an etch selection ratio with respect to the conformal ferromagnetic layer. Before forming the conformal ferromagnetic layer, a capping layer may be formed on the digit line, with sidewalls of the capping layer being aligned with sidewalls of the digit line, and the conformal ferromagnetic layer may be formed on sidewalls of the ferromagnetic plate, the digit line, and the capping layer. The ferromagnetic spacers may be on at least portions of sidewalls of the capping layer. More particularly, the capping layer may include an insulating layer and a mask layer, and the mask layer may include a material having an etch selection ratio with respect to at least one of the ferromagnetic layer and/or the ferromagnetic spacers. Moreover, the mask layer may be removed.

A ferromagnetic plate may be formed on the bit line, and forming the ferromagnetic spacers may include, after forming the ferromagnetic plate, forming a conformal ferromagnetic layer on the bit line and the ferromagnetic plate and anisotropic etching the conformal ferromagnetic layer. Before forming the conformal ferromagnetic layer, a capping layer may be formed on the ferromagnetic plate. More particularly, sidewalls of the capping layer may be aligned with sidewalls of the bit line, and the conformal ferromagnetic layer may be formed on sidewalls of the ferromagnetic plate, the bit line, and the capping layer. More particularly, the ferromagnetic spacers may be on at least portions of sidewalls of the capping layer, and the capping layer may include an insulating layer and a mask layer, with the mask layer including a material having an etch selection ratio with respect to at least one of the ferromagnetic plate and/or the ferromagnetic spacers. I addition, the mask layer may be removed.

First and second ferromagnetic plates may be provided. More particularly, the first ferromagnetic plate may be formed between the digit line and the substrate, and forming the ferromagnetic spacers may include, before forming the first insulating layer, forming a first conformal ferromagnetic layer on the digit line and the first ferromagnetic plate and anisotropic etching the first conformal ferromagnetic layer. The second ferromagnetic plate may be formed on the bit line, and forming the ferromagnetic spacers may include, after forming the second ferromagnetic plate, forming a second conformal ferromagnetic layer on the bit line and the second ferromagnetic plate and anisotropic etching the second conformal ferromagnetic layer. The digit line may include a conductive material having an etch selection ratio with respect to the first conformal ferromagnetic layer.

Before forming the first conformal ferromagnetic layer, a first capping layer may be formed on the digit line, sidewalls of the first capping layer may be aligned with sidewalls of the digit line, and the first conformal ferromagnetic layer may cover the first ferromagnetic plate, the digit line, and the first capping layer. Before forming the second conformal ferromagnetic layer, a second capping layer may be formed on the second ferromagnetic plate, sidewalls of the second capping layer may be aligned with sidewalls of the bit line, and the second conformal ferromagnetic layer may cover the bit line, the second ferromagnetic plate, and the second capping layer. The ferromagnetic spacers on the digit line may extend on at least portions of sidewalls of the first capping layer, and the ferromagnetic spacers on the bit line may extend on at least portions of sidewalls of the second capping layer. Moreover, the first capping layer may include a first cap insulating layer and a first mask layer, and the first mask layer may include a material having an etch selection ratio with respect to at least one of the first ferromagnetic plate and/or the first ferromagnetic spacers. Similarly, the second capping layer may include a second cap insulating layer and a second mask layer, and the second mask layer may include a material having an etch selection ratio with respect to at least one of the second ferromagnetic plate and/or the second ferromagnetic spacers. In addition, the first and second mask layers may be removed.

According to some embodiments of the present invention, a magnetic memory device may reduce power consumption by improving efficiency of a magnetic field applied to an MTJ memory cell. According to some other embodiments of the present invention, a unit cost of production of a magnetic memory device may be reduced.

According to embodiments of the present invention, a magnetic memory device may include a digit line disposed on a lower insulation film formed on a substrate, and an MTJ memory cell disposed on the digit line by intervening an intermediate insulation film. A bit line may be disposed on the MTJ memory cell by intervening an upper insulation film. The bit line may cross the digit line. A magnetic focusing unit may include a spacer formed on both sidewalls of at least one of the digit line and the bit line. The magnetic focusing unit may be made of a ferromagnetic material.

The magnetic focusing unit may include a lower plate pattern positioned between the digit line and the lower insulation film, and a lower spacer disposed on both sidewalls of the lower plate pattern and the digit line. In this case, at least the upper portion of the digit line may be made of a conductive material having an etch selection ratio with respect to the lower spacer. In addition, the device may further include a lower capping pattern disposed on the digit line and having sidewalls aligned on the sidewalls of the digit line. Here, the intermediate insulation film may cover the lower capping pattern. The lower spacer may extend upwardly to cover at least part of the sidewalls of the lower capping pattern. The lower capping pattern may include an insulation pattern or an insulation pattern/a mask pattern. The mask pattern may be made of a material having an etch selection ratio with respect to the lower plate pattern and/or the lower spacer The magnetic focusing unit may include an upper plate pattern and an upper spacer. The upper plate pattern may be disposed on the bit line and may have sidewalls aligned on the sidewalls of the bit line. The upper spacer may be formed on both sidewalls of the bit line and the upper plate pattern. The device may also include an upper capping pattern disposed on the upper plate pattern and having sidewalls aligned on the sidewalls of the bit line. The upper spacer may extend upwardly to cover at least part of the sidewalls of the upper capping pattern. The upper capping pattern may include an insulation pattern or an insulation pattern/a mask pattern. The mask pattern may be made of a material having an etch selection ratio with respect to the upper plate pattern and/or the upper spacer.

The magnetic focusing unit may also include a lower plate pattern positioned between the digit line and the lower insulation film, a lower spacer disposed on both sidewalls of the lower plate pattern and the digit line, an upper plate pattern being disposed on the bit line and having sidewalls aligned on the sidewalls of the bit line, and an upper spacer formed on both sidewalls of the bit line and the upper plate pattern. In this case, at least the upper portion of the digit line may be made of a conductive material having an etch selection ratio with respect to the lower spacer. In addition, the device may further include a lower capping pattern and an upper capping pattern. The lower capping pattern may be disposed on the digit line and may have sidewalls aligned on the sidewalls of the digit line. The upper capping pattern may be disposed on the upper plate pattern and may have sidewalls aligned on the sidewalls of the bit line. The lower spacer may extend upwardly to cover at least part of the sidewalls of the lower capping pattern, and the upper spacer may extend upwardly to cover at least part of the sidewalls of the upper capping pattern. The lower capping pattern may include a first insulation pattern or a first insulation pattern/a first mask pattern, and the upper capping pattern may include a second insulation pattern or a second insulation pattern/a second mask pattern. The first mask pattern may be made of a material having an etch selection ratio with respect to the lower plate pattern and/or the lower spacer, and the second mask pattern may be made of a material having an etch selection ratio with respect to the upper plate pattern and/or the upper spacer.

According to other embodiments of the present invention, a method for forming a magnetic memory device may include forming a digit line on a lower insulation film formed on a substrate, and forming an MTJ memory cell on the digit line by intervening an intermediate insulation film. An upper insulation film may be formed on the substrate, and a bit line may be formed on the upper insulation film and on the MTJ memory cell to cross the digit line. A magnetic focusing unit including a spacer may be formed on both sidewalls of at least one of the digit line and the bit line. The magnetic focusing unit is made of a ferromagnetic material.

Forming the magnetic focusing unit may include forming a lower plate pattern positioned between the lower insulation film and the digit line, conformally forming a lower spacer film covering the lower plate pattern and the digit line on the substrate, and forming a lower spacer on both sidewalls of the digit line and the lower plate pattern by anisotropic-etching the lower spacer film. The magnetic focusing unit may include the lower plate pattern and the lower spacer. At least the upper portion of the digit line may be made of a conductive material having an etch selection ratio with respect to the lower spacer film. In addition, the method may further include forming a lower capping pattern disposed on the digit line and having sidewalls aligned on the sidewalls of the digit line, before forming the lower spacer film. In this case, the lower spacer film may be formed to cover the lower plate pattern, the digit line and the lower capping pattern. The lower spacer may extend upwardly to cover at least part of the sidewalls of the lower capping pattern. The lower capping pattern may include an insulation pattern and a mask pattern that are sequentially stacked. The mask pattern may be made of a material having an etch selection ratio with respect to the lower plate pattern and/or the lower spacer film. The method may further include removing the mask pattern.

Forming the magnetic focusing unit may include forming an upper plate pattern disposed on the bit line, conformally forming an upper spacer film covering the bit line and the upper plate pattern on the whole surface of the substrate, and forming an upper spacer on both sidewalls of the bit line and the upper plate pattern by anisotropic-etching the upper spacer film. The magnetic focusing unit may include the upper plate pattern and the upper spacer. The method may further include forming an upper capping pattern disposed on the upper plate pattern and having sidewalls aligned on the sidewalls of the bit line, before forming the upper spacer film. The upper spacer film may be formed to cover the bit line, the upper plate pattern and the upper capping pattern. The upper spacer may extend upwardly to cover at least part of the sidewalls of the upper capping pattern. The upper capping pattern may include an insulation pattern and a mask pattern that are sequentially stacked. The mask pattern may be made of a material having an etch selection ratio with respect to the upper plate pattern and/or the upper spacer film. The method may further include removing the mask pattern.

Forming the magnetic focusing unit may include forming a lower plate pattern positioned between the lower insulation film and the digit line, conformally forming a lower spacer film covering the lower plate pattern and the digit line on the substrate, forming a lower spacer on both sidewalls of the digit line and the lower plate pattern by anisotropic-etching the lower spacer film, forming an upper plate pattern disposed on the bit line, conformally forming an upper spacer film covering the bit line and the upper plate pattern on the whole surface of the substrate, and forming an upper spacer on both sidewalls of the bit line and the upper plate pattern by anisotropic-etching the upper spacer film. The magnetic focusing unit may include the lower plate pattern, the lower spacer, the upper plate pattern and the upper spacer. At least the upper portion of the digit line may be made of a conductive material having an etch selection ratio with respect to the lower spacer film. In addition, the method may further include forming a lower capping pattern disposed on the digit line and having sidewalls aligned on the sidewalls of the digit line, before forming the lower spacer film, and forming an upper capping pattern disposed on the upper plate pattern and having sidewalls aligned on the sidewalls of the bit line, before forming the upper spacer film. The lower spacer film may be formed to cover the lower plate pattern, the digit line and the lower capping pattern, and the upper spacer film may be formed to cover the bit line, the upper plate pattern and the upper capping pattern. The lower spacer may extend upwardly to cover at least part of the sidewalls of the lower capping pattern, and the upper spacer may extend upwardly to cover at least part of the sidewalls of the upper capping pattern. The lower capping pattern may include a first insulation pattern and a first mask pattern that are sequentially stacked, and the upper capping pattern may include a second insulation pattern and a second mask pattern that are sequentially stacked. The first mask pattern may be made of a material having an etch selection ratio with respect to the lower plate pattern and/or the lower spacer film, and the second mask pattern may be made of a material having an etch selection ratio with respect to the upper plate pattern and/or the upper spacer film. The method may further include removing the first mask pattern, and removing the second mask pattern.

BRIEF DESCRIPTION OF THE DRAWINGS

The accompanying drawings are included to provide a further understanding of the invention, and are incorporated in and constitute a part of this specification. The drawings illustrate embodiments of the present invention and, together with the description, serve to explain principles of the present invention.

FIGS. 3A to 5A are cross-sectional views illustrating steps of forming the magnetic memory device of FIG. 2A.

FIGS. 3B to 5B are cross-sectional views taken along lines II-II' of FIGS. 3A to 5A, respectively.

FIGS. 7A to 10A are cross-sectional views illustrating steps of forming the magnetic memory device of FIG. 6A.

FIGS. 7B to 10B are cross-sectional views taken along lines IV-IV' of FIGS. 7A to 10A, respectively.

DETAILED DESCRIPTION

Figure 1:
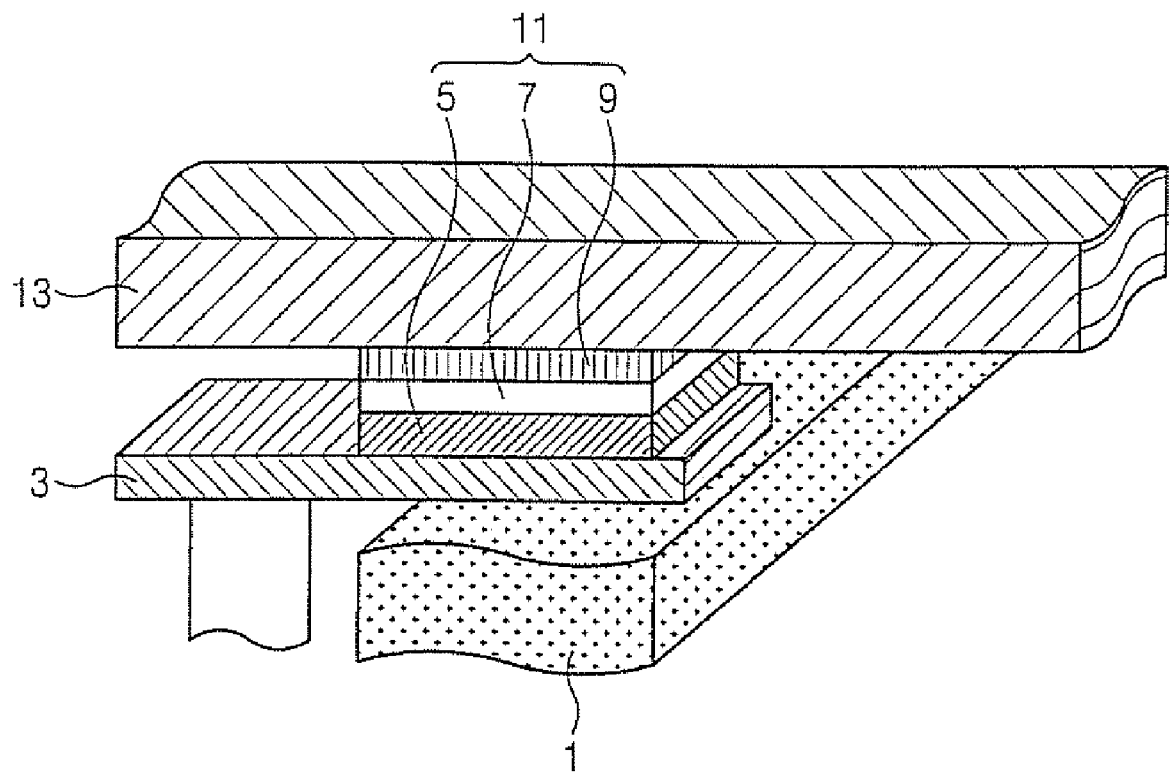
FIG. 1 is a schematic diagram illustrating a conventional magnetic memory device having an MTJ memory cell.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items.

Furthermore, relative terms, such as beneath, upper, and/or lower may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted and/or etched region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Figure 2A:
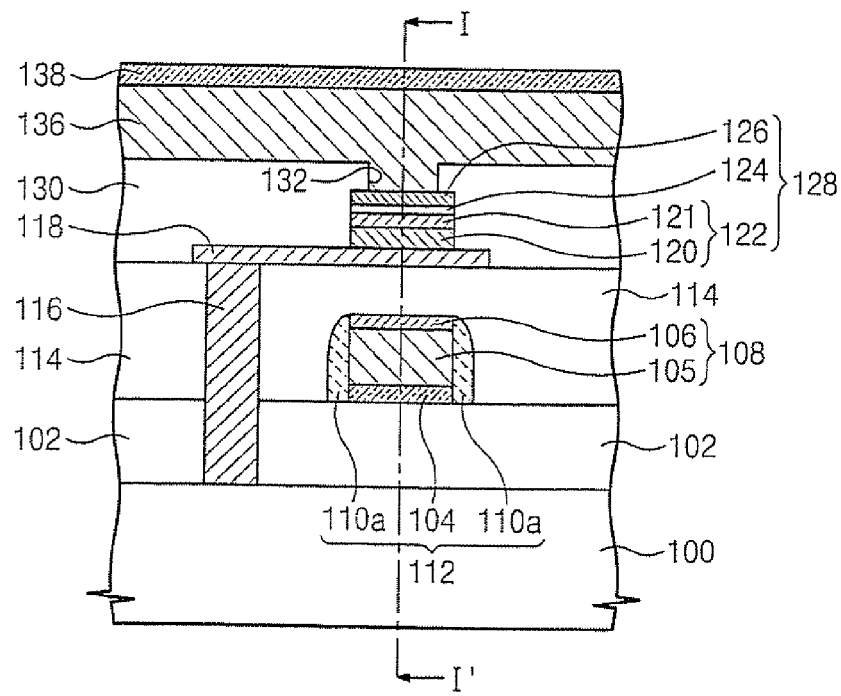
FIG. 2A is a cross-sectional view illustrating a magnetic memory device according to first embodiments of the present invention.
Figure 2B:
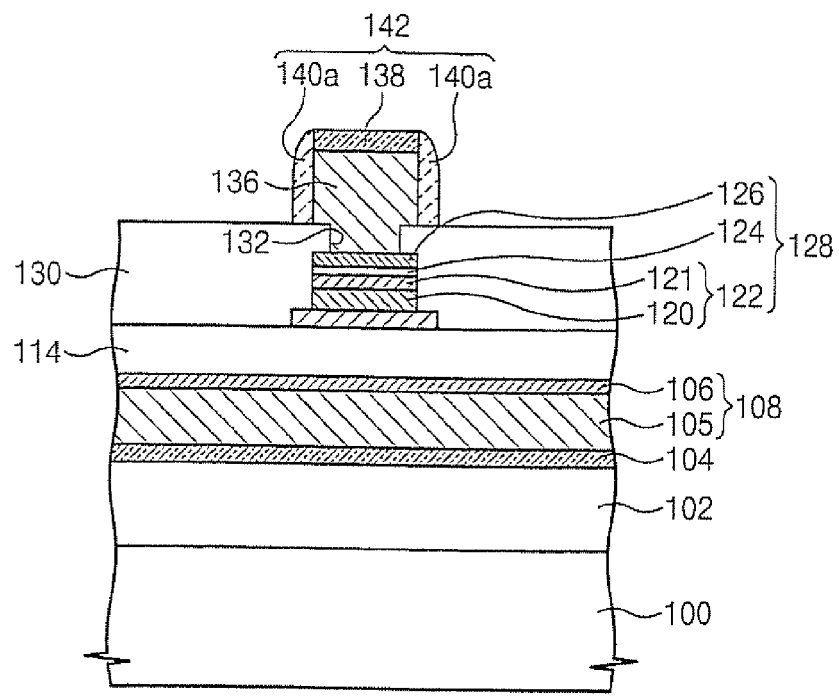
FIG. 2B is a cross-sectional view taken along line I-I' of FIG. 2A.

FIG. 2A is a cross-sectional view illustrating a magnetic memory device according to first embodiments of the present invention, and FIG. 2B is a cross-sectional view taken along line I-I' of FIG. 2A. FIGS. 2A and 2B show sections of a digit line and a bit line of the magnetic memory device according to first embodiments of the present invention.

Referring to FIGS. 2A and 2B, a lower insulation film 102 may be disposed on a semiconductor substrate 100 (hereinafter, referred to as 'substrate'). The lower insulation film 102 may be a silicon oxide film. In addition or in an alternative, the lower insulation film 102 may include another insulating material.

A digit line 108 may be disposed on the lower insulation film 102, and a bit line 136 may cross an upper portion of the digit line 108. An MTJ memory cell 128 may be positioned between the digit line 108 and the bit line 136. That is, the MTJ memory cell 128 may be provided at an intersection of the digit line 108 and the bit line 136, and the digit line 108 and the bit line 136 may be provided at the lower and upper portions of the MTJ memory cell 128, respectively. An intermediate insulation film 114 may be positioned between the digit line 108 and the MTJ memory cell 128, and an upper insulation film 130 may be positioned between the MTJ memory cell 128 and the bit line 136. The intermediate insulation film 114 may extend laterally to cover the lower insulation film 102, and the upper insulation film 130 may extend laterally to cover the intermediate insulation film 114. The intermediate and upper insulation films 114 and 130 may each be silicon oxide films. In addition or in an alternative, the intermediate and/or upper insulation films 114 and/or 130 may include other insulating materials.

A bottom surface of the MTJ memory cell 128 may be electrically connected to a MOS transistor (not shown) that acts as a switching element through an electrode 118 positioned between the interlayer insulation film 114 and the MTJ memory cell 128. The electrode 118 may extend to one side. The extended part of the electrode 118 may be electrically connected to a source/drain region (not shown) of the MOS transistor through a conductive plug 116 passing through the intermediate and lower insulation films 114 and 102. The bit line 136 may contact the top surface of the MTJ memory cell 128 through a contact hole 132 passing through the upper insulation film 130.

The MTJ memory cell 128 may include a lower pattern 122, a tunnel barrier pattern 124 and an upper pattern 126 that are sequentially stacked. The upper pattern 126 may include a layer of a ferromagnetic material that may freely change a magnetization direction. The upper pattern 126 may be a layer of a single material such as Fe, Co and Ni, and/or compounds thereof. The tunnel barrier pattern 124 may be an aluminum oxide film. A magnetization direction of the lower pattern 122 may be fixed. The lower pattern 122 may include a pinning pattern 120 and a pinned pattern 121 that are sequentially stacked. A magnetization direction of the pinned pattern 121 may be fixed by the pinning pattern 120. The pinning pattern 120 may be a layer of a semi-ferromagnetic material, and the pinned pattern 121 may be a layer of a ferromagnetic material. For example, the pinning pattern 120 may be a layer of IrMn and/or PtMn. The pinned pattern 121 may be a layer of a single material such as Fe, Ni and Co, and/or compounds thereof. Although not illustrated, the lower pattern 122 may be a composite of two or more layers.

A magnetic focusing unit may focus magnetic fields generated from the digit line 108 and/or the bit line 136. The magnetic focusing unit may include spacers on both sidewalls of at least one of the digit line 108 and/or the bit line 136. More particularly, a magnetic focusing unit may include at least one of a lower magnetic focusing unit 112 focusing the magnetic field of the digit line 108 and/or an upper magnetic focusing unit 142 focusing the magnetic field of the bit line 136. Here, the magnetic focusing unit may include a ferromagnetic material.

The lower magnetic focusing unit 112 may include a lower plate pattern 104 positioned between the digit line 108 and the lower insulation film 102, and lower spacers 110a formed on sidewalls of the digit line 108. The lower plate pattern 104 may have sidewalls aligned with sidewalls of the digit line 108, and the lower spacer 110a may extend downward on sidewalls of the lower plate pattern 104. The lower magnetic focusing unit 112 may thus be provided on the bottom surface and both sidewalls of the digit line 108, thereby focusing the magnetic field generated from the digit line 108. The intermediate insulation film 114 may cover the lower spacers 110a.

The lower magnetic focusing unit 112 may be made of a ferromagnetic material. That is, the lower plate pattern 104 and the lower spacer 110a may be made of ferromagnetic materials. For example, the lower plate pattern 104 and the lower spacer 110a may be made of single films such as NiFe, CoFe and/or CoFeB, composite films thereof. Here, the lower plate pattern 104 and the lower spacer 110a may be made of different and/or the same ferromagnetic materials.

At least an upper portion 106 of the digit line 108 may include a conductive material having an etch selection ratio with respect to the lower plate pattern 104 and/or the lower spacer 110a. More particularly, the upper portion 106 of the digit line 108 may be made of a conductive material having an etch selection ratio with respect to the lower spacer 110a in a sputter etching. In addition, the upper portion 106 of the digit line 108 may have an etch selection ratio with respect to the lower plate pattern 104. For example, the upper portion 106 of the digit line 108 may be made of a single film such as Ti, Ta, TiN, TaN, and/or Al, and/or a composite film thereof. The lower portion 105 of the digit line 108 may include a metal having a relatively low specific resistance that may be patterned. For example, the lower portion 105 of the digit line 108 may include Al and/or an Al alloy. Furthermore, the lower portion 105 of the digit line 108 may additionally include a bonding layer such as Ti and/or Ta contacting the lower plate pattern 104.

The upper magnetic focusing unit 142 may include an upper plate pattern 138 on the bit line 136, and upper spacers 140a may have on sidewalls of the bit line 136. The upper plate pattern 138 may have sidewalls aligned with sidewalls of the bit line 136, and the upper spacer 140a may extend upwardly to be disposed on both sidewalls of the upper plate pattern 138. Accordingly, the upper magnetic focusing unit 142 may surround both sidewalls and the top surface of the bit line 136, thereby focusing the magnetic field generated from the bit line 136.

The upper magnetic focusing unit 142 may include a ferromagnetic material. That is, the upper plate pattern 138 and the upper spacers 140a may include films of one or more of NiFe, CoFe and/or CoFeB that are ferromagnetic materials, and/or composite films thereof. Here, the upper plate pattern 138 and the upper spacer 140a may be made of different and/or the same ferromagnetic materials.

The bit line 136 may include a metal having a relatively low specific resistance that may be patterned. For example, the bit line 136 may include Al and/or an Al alloy. the bit line 136 may additionally include a bonding layer such as Ti and/or Ta contacting the upper insulation film 130. In addition, the bit line 136 may include a conductive barrier layer for protecting the top surface thereof. For example, the conductive barrier layer may be made of a single film such as Ti, Ta, TiN, TaN, and/or Al, and/or a composite film thereof.

The magnetic focusing unit may include only the lower magnetic focusing unit 112. In an alternative, the magnetic focusing unit may include only the upper magnetic focusing unit 142. In another alternative, the magnetic focusing unit may include both the lower and upper magnetic focusing units 112 and 142.

In above-described magnetic memory devices, the magnetic focusing unit may focus magnetic fields generated from the digit line 108 and/or the bit line 136, thereby reducing an amount of current applied to the digit line 108 and/or the bit line 136 to generate the magnetic fields. As a result, power consumption of the magnetic memory device may be reduced.

In addition, the magnetic focusing unit may include the spacers 110a and/or 140a disposed on both sidewalls of the digit line 108 and/or the bit line 136. The digit line 108 and/or the bit line 136 may be formed according to a patterning process. That is, the digit line 108 and/or the bit line 136 may be formed according to a patterning process reducing a unit cost of production, and the magnetic focusing unit may be relatively easily formed, resulting in relatively high productivity and relatively low power consumption.

Figure 3A:
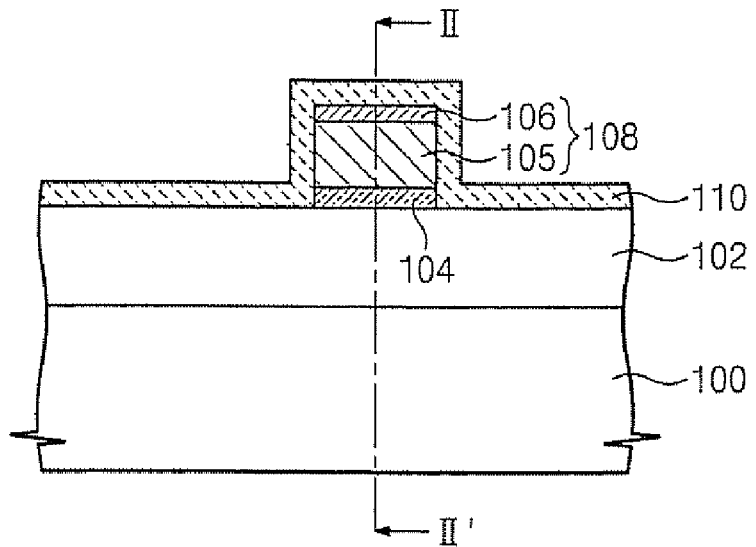
Figure 3B:
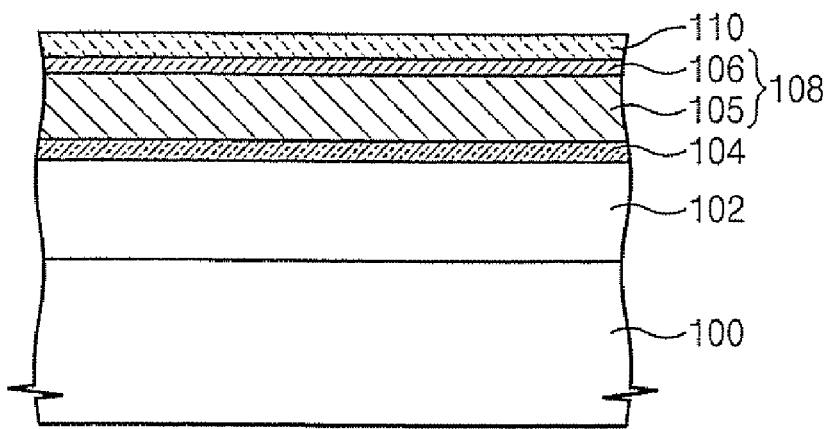

FIGS. 3A to 5A are cross-sectional views illustrating sequential steps of forming the magnetic memory device of FIG. 2A, and FIGS. 3B to 5B are cross-sectional views taken along lines II-II' of FIGS. 3A to 5A, respectively. As shown in FIGS. 3A and 3B, a lower insulation film 102 may be formed on a substrate 100. The lower insulation film 102 may be a silicon oxide film and/or another insulating film.

A first ferromagnetic film and a first conductive film may be sequentially formed on the lower insulation film 102. A lower plate pattern 104 and a digit line 108 that are sequentially stacked may be formed by consecutively patterning the first conductive film and the first ferromagnetic film. The lower plate pattern 104 may be patterned from the first ferromagnetic film, and the digit line 108 may be patterned from the first conductive film. A lower spacer film 110 may be conformally formed on a whole surface of the substrate 100 to cover the lower plate pattern 104 and the digit line 108. More particularly, the lower spacer film 110 may be made of a ferromagnetic material.

The lower plate pattern 104 and the lower spacer film 110 may each be made of a film of a material such as NiFe, CoFe and/or CoFeB, and/or composite films thereof. At least an upper portion 106 of the digit line 108 is made of a conductive material having an etch selection ratio with respect to the lower spacer film 110. More particularly, the upper portion 106 of the digit line 108 may be made of a conductive material having an etch selection ratio with respect to the lower spacer film 110 during a sputtering etching. In addition, the upper portion 106 of the digit line 108 may have an etch selection ratio with respect to the first ferromagnetic film. For example, the upper portion 106 of the digit line 108 may include a film of Ti, Ta, TiN, and/or TaN, and/or a composite film thereof. The lower portion 105 of the digit line 108 may include a metal having a relatively low specific resistance that may be patterned. For example, the lower portion 105 of the digit line 108 may include Al and/or an Al alloy. Furthermore, the lower portion 105 of the digit line 108 may additionally include a bonding layer (for example, Ti and/or Ta) contacting the lower insulation film 102. The lower spacer film 110 may be made of a ferromagnetic material. That is, the lower spacer film 110 may include a film of NiFe, CoFe, and/or CoFeB, and/or composite films thereof. Here, the lower plate pattern 104 and the lower spacer film 110 may be made of different or the same ferromagnetic materials.

Figure 4A:
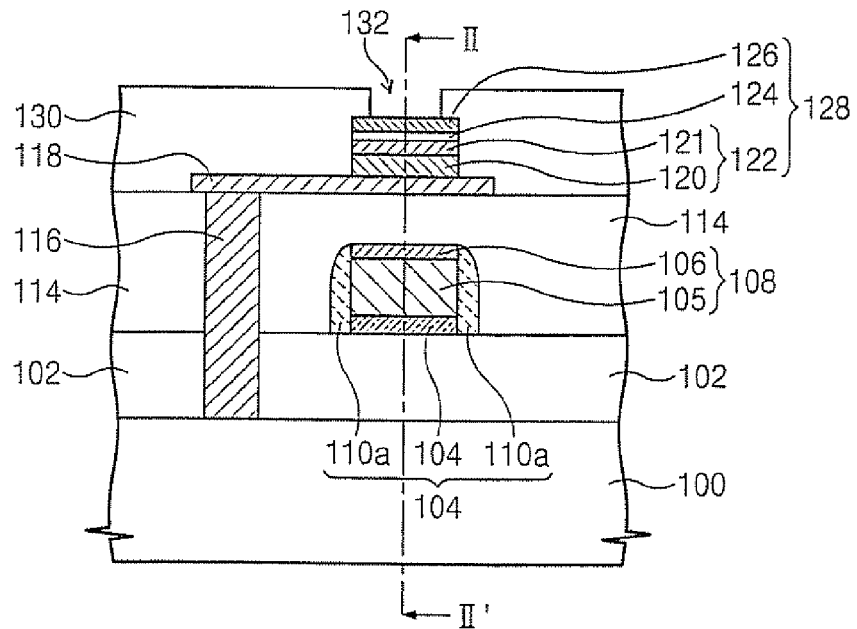
Figure 4B:
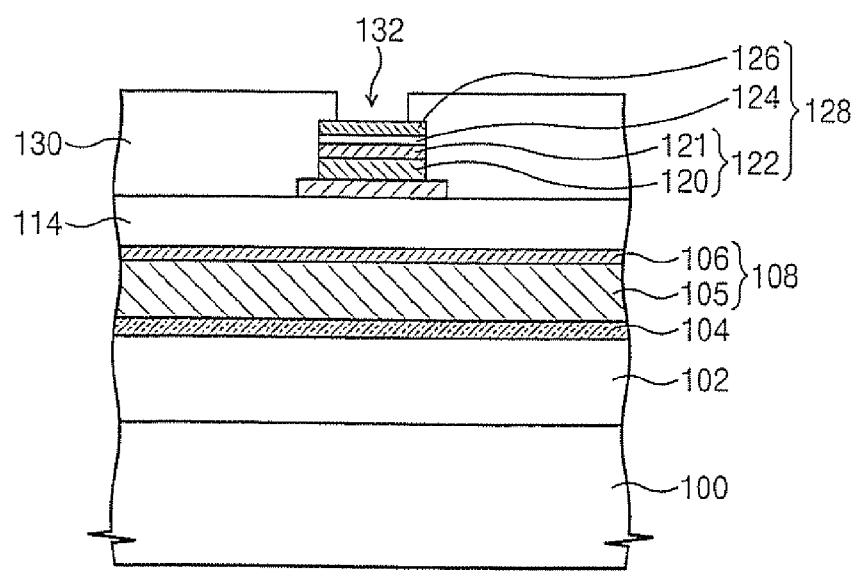

Referring to FIGS. 4A and 4B, a lower spacer 110a may be formed on both sidewalls of the digit line 108 and the lower plate pattern 140 by anisotropic-etching the lower spacer film 110. During the anisotropic-etching, the upper portion 106 of the digit line 108 may protect the lower portion 105 of the digit line 108. As the lower spacer 110a is formed, the lower insulation film 102 near the lower spacer film 110 may be exposed. The anisotropic etching for forming the lower spacer 110a may be a sputtering etching. In this case, the upper portion 106 of the digit line 108 may protect the lower portion 105 of the digit line 108 including a metal layer. The lower plate pattern 104 and the lower spacer 110a may thus provide the lower magnetic focusing unit 112.

An intermediate insulation film 114 may be formed over the resulting structure. The intermediate insulation film 114 may be made a silicon oxide film and/or another insulating film. A conductive plug 116 passing through the intermediate and lower insulation films 114 and 102 and contacting a predetermined region of the substrate 100 may be formed at one side of the digit line 108. An electrode 118 electrically connected to the conductive plug 116 may be formed on the interlayer insulation film 114. The electrode 118 may be a film of a material such as Ti, Ta, TiN, and/or TaN, and/or a composite film thereof.

An MTJ memory cell 128 may be formed on the electrode 118. The MTJ memory cell 128 may be formed on the digit line 108 with the intermediate insulation film 114 there between. The MTJ memory cell 128 may include a lower pattern 122, a tunnel barrier pattern 124, and an upper pattern 126 that are sequentially stacked. A magnetization direction of the lower pattern 122 may be fixed. The lower pattern 122 may include a pinning pattern 120 and a pinned pattern 121 that are sequentially stacked. The pinning pattern 120 and the pinned pattern 121 may be layers of a semi-ferromagnetic material and a ferromagnetic material, respectively. Accordingly, a magnetization direction of the pinned pattern 121 may be fixed by the pinning pattern 120. The lower pattern 122 may include a composite layer having two or more layers. The upper pattern 126 may be a layer of a ferromagnetic material that may freely change a magnetization direction.

The pinning pattern 120 may be a layer of IrMn and/or PtMn. The pinned pattern 121 and the upper pattern 126 may each be a layer of a material such as Fe, Co, and/or Ni, or compounds thereof. The tunnel barrier pattern 124 may be a layer of an aluminum oxide film.

An upper insulation film 130 may be formed on a whole surface of the substrate 100. The upper insulation film 130 may be a silicon oxide film and/or another insulating film. A top surface of the upper insulation film 130 may be leveled. A contact hole 132 exposing the top surface of the MTJ memory cell 128 may be formed by patterning the upper insulation film 130.

Figure 5A:
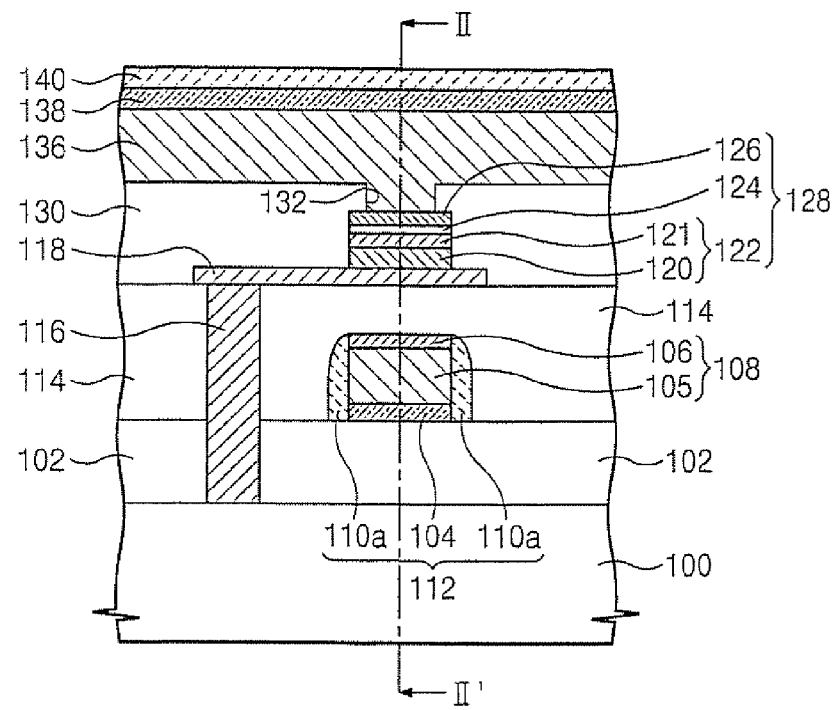
Figure 5B:
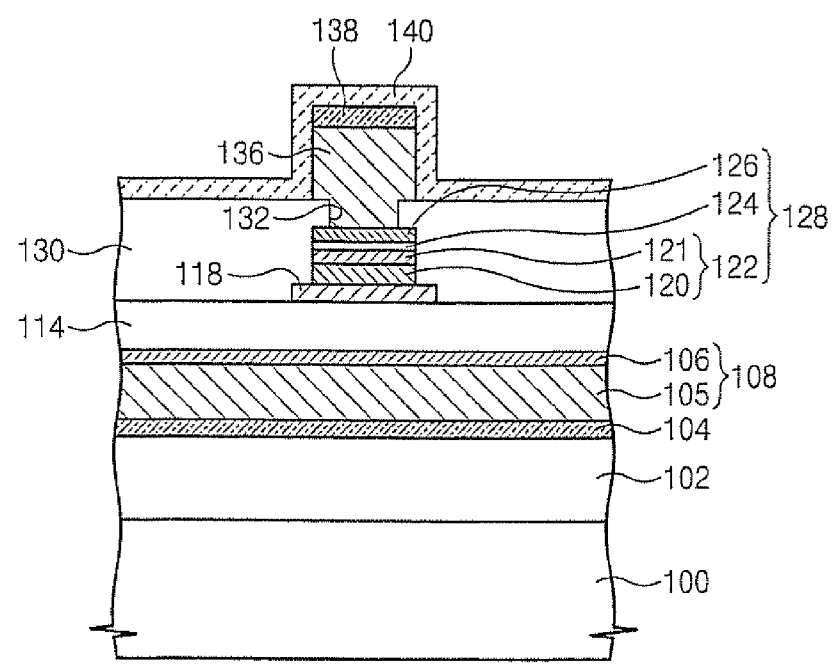

As depicted in FIGS. 5a and 5b, a second conductive film may be formed to fill the contact hole 132, and a second ferromagnetic film may be formed on the second conductive film. A bit line 136 and an upper plate pattern 138 that are sequentially stacked may be formed by consecutively patterning the second ferromagnetic film and the second conductive film. The bit line 136 crosses the digit line 108 and may be provided on the MTJ memory cell 128. The bit line 136 may be made of the second conductive film, and the upper plate pattern 138 may be made of the second ferromagnetic film.

The upper plate pattern 138 may be a film of a material such as NiFe, CoFe, and/or CoFeB, and/or a composite film thereof. The bit line 136 may include a metal having a relatively low specific resistance that may be patterned. For example, the bit line 136 may be an Al layer and/or an Al alloy layer. The bit line 136 may include a bonding layer (for example, Ti and/or Ta) contacting the upper insulation film 130, and/or a conductive barrier layer for protecting the top surface thereof. For example, the conductive barrier layer may a film of a material such as Ti, Ta, TiN, and/or TaN, and/or a composite film thereof.

An upper spacer film 140 may be conformally formed on a whole surface of the substrate 100 to cover the upper plate pattern 138 and the bit line 136. The upper spacer film 140 may include a ferromagnetic material. For example, the upper spacer 140 may be a film of a material such as NiFe, CoFe, and/or CoFeB, and/or a composite film thereof.

The upper spacer 140a of FIG. 2B may be formed by anisotropic-etching the upper spacer film 140. The upper spacer 140a and the upper plate pattern 138 may provide the upper magnetic focusing unit 142 of FIG. 2B. The upper insulation film 130 near the upper spacer 140a may be exposed. The anisotropic etching for forming the upper spacer 140a may be a sputtering etching. The upper plate pattern 138 may be partially etched in the formation of the upper spacer 140a. However, the upper plate pattern 138 may be formed sufficiently thick to maintain sufficient thickness.

The lower and upper magnetic focusing units 112 and 142 may be included in the magnetic focusing unit. Moreover, methods for forming the magnetic memory device may include all methods for forming the lower and upper magnetic focusing units 112 and 142. However, methods for forming the magnetic memory device may omit either one of the lower and upper magnetic focusing units 112 and 142.

In forming the magnetic memory device, the digit line 108 and/or the bit line 136 may be formed according to a patterning process reducing the unit cost of production. The magnetic focusing unit may include the spacers 110a and 140a to surround both walls of the digit line 108 and/or the bit line 136.

As a result, productivity of magnetic memory devices may be improved by forming the digit line 108 and/or the bit line 136 according to patterning processes as discussed above. In addition, power consumption of the magnetic memory device may be reduced by forming magnetic focusing unit.

Figure 6A:
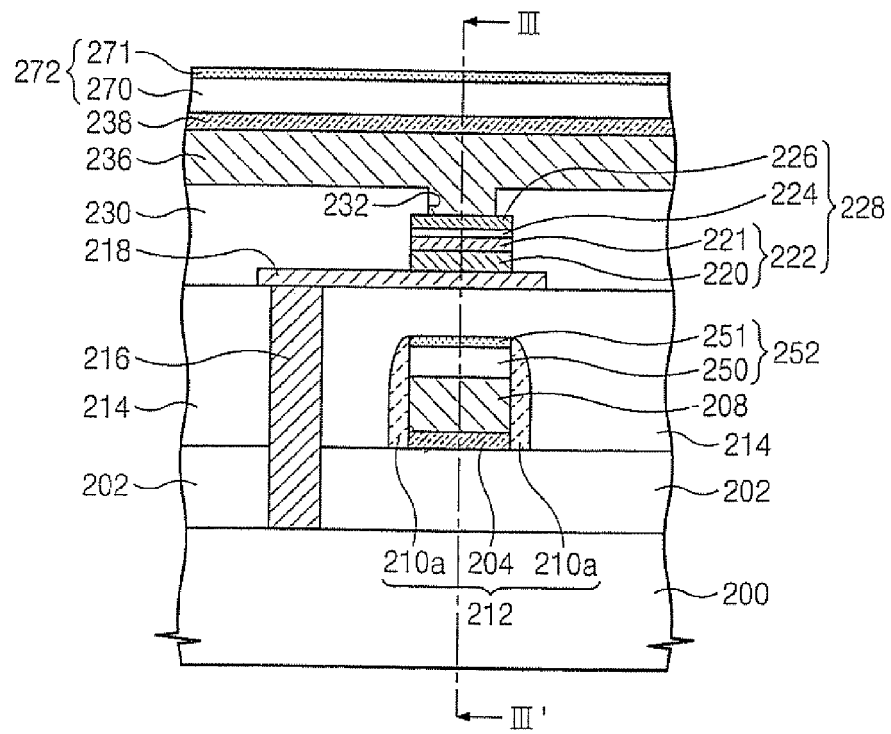
FIG. 6A is a cross-sectional view illustrating a magnetic memory device according to second embodiments of the present invention.
Figure 6B:
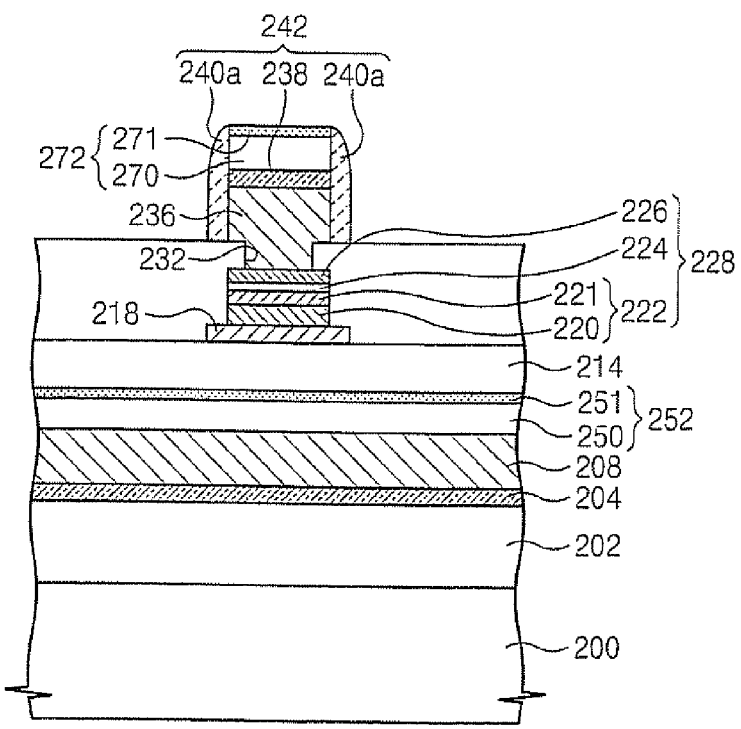
FIG. 6B is a cross-sectional view taken along line III-III' of FIG. 6A.

FIG. 6A is a cross-sectional illustrating a magnetic memory device according to second embodiments of the present invention, and FIG. 6B is a cross-sectional view taken along line III-III' of FIG. 6A.

As illustrated in FIGS. 6A and 6B, a lower insulation film 202 may be disposed on a substrate 200, and a digit line 208 may be disposed on the lower insulation film 202. A bit line 236 crosses the upper portion of the digit line 208. An MTJ memory cell 228 may be positioned between the digit line 208 and the bit line 236.

An intermediate insulation film 214 may be positioned between the digit line 208 and the MTJ memory cell 228. An upper insulation film 230 may be positioned between the MTJ memory cell 228 and the bit line 236. The intermediate insulation film 214 may cover the lower insulation film 202, and the upper insulation film 230 may cover the intermediate insulation film 214.

A bottom surface of the MTJ memory cell 228 may be electrically connected to the substrate 200 through an electrode 218 positioned between the intermediate insulation film 214 and the MTJ memory cell 228 and a conductive plug 216 passing through the intermediate and lower insulation films 214 and 202. The bit line 236 may contact a top surface of the MTJ memory cell 228 via a contact hole 232 passing through the upper insulation film 230.

The MTJ memory cell 228 may include a lower pattern 222, a tunnel barrier pattern 224, and an upper pattern 226 that are sequentially stacked. A magnetization direction of the lower pattern 222 may be fixed, and a magnetization direction of the upper pattern 226 may be changeable by a magnetic field. The lower pattern 222 may include a pinning pattern 220 and a pinned pattern 221 that are sequentially stacked. The lower pattern 222 may be a composite layer having two or more layers. The upper pattern 226 and the pinned pattern 221 may be made of ferromagnetic materials, and the pinning pattern 220 may be made of a semi-ferromagnetic material. The tunnel barrier pattern 224 may be an aluminum oxide film. The lower pattern 222 and the upper pattern 226 may be layers of the same materials as those of the corresponding elements of the first embodiments discussed above with respect to FIGS. 2A-5B.

A magnetic focusing unit may focus magnetic fields of the digit line 208 and/or the bit line 236. A magnetic focusing unit may include spacers 210a and 240a disposed on both sidewalls of at least one of the digit line 208 and/or the bit line 236. In greater detail, the magnetic focusing unit may include at least one of a lower magnetic unit 212 focusing a magnetic field of the digit line 208, and/or an upper magnetic focusing unit 242 focusing a magnetic field of the bit line 236. As discussed above with respect to FIGS. 2A-5B, the magnetic focusing unit may be made of a ferromagnetic material.

The lower magnetic focusing unit 212 may include a lower plate pattern 204 positioned between the digit line 208 and the lower insulation film 202, and lower spacers 210a disposed on both sidewalls of the digit line 208. The lower plate pattern 204 may have sidewalls aligned with the sidewalls of the digit line 208, and the lower spacers 210a may extend downwardly to be disposed on both sidewalls of the lower plate pattern 204. A lower capping pattern 252 may be disposed on the digit line 208. The lower capping pattern 252 may have sidewalls aligned with the sidewalls of the digit line 208. Here, the lower spacers 210a may extend upwardly to cover at least part of the sidewalls of the lower capping pattern 252. As shown in FIG. 6A, the lower spacers 210a may cover whole sidewalls of the lower capping pattern 252. The intermediate insulation film 214 may cover the lower capping pattern 252. That is, the lower capping pattern 252 may be positioned between the intermediate insulation film 214 and the top surface of the digit line 208.

The lower plate pattern 204 and the lower spacers 210a may comprise ferromagnetic materials. For example, the lower plate pattern 204 and the lower spacers 210a may comprise single films such as NiFe, CoFe, and/or CoFeB, and/or composite films thereof. Here, the lower plate pattern 204 and the lower spacer 210a may be made of identical or different ferromagnetic materials.

The lower capping pattern 252 may include at least a first insulation pattern 250. For example, the first insulation pattern 250 may be made of a single film such as a silicon oxide film, a silicon nitride film, and/or a silicon oxynitride film, and/or a composite film thereof. Exemplary silicon oxide films used as the first insulation pattern 250 may include one or more of plasma-TEOS, USG, PSG, BPSG, HTO and MTO.

The lower capping pattern 252 may further include a first mask pattern 251 stacked on the first insulation pattern 250. The first mask pattern 251 may be made of a material having an etch selection ratio with respect to the lower plate pattern 204 and/or the lower spacers 210a. More particularly, the first mask pattern 251 may be made of a material having an etch selection ratio with respect to the lower plate pattern 204 and/or the lower spacers 210a in sputtering etching. For example, the first mask pattern 251 may be made of a single film such as Ti, Ta, TiN, TaN, and/or TaN, and/or Al, and/or a composite film thereof.

The upper magnetic focusing unit 242 may include an upper plate pattern 238 disposed on the bit line 236, and upper spacers 240a disposed on both sidewalls of the bit line 236. The upper plate pattern 238 may have sidewalls aligned with the sidewalls of the bit line 236, and the upper spacer 240a may extend upwardly to be disposed on both sidewalls of the upper plate pattern 238. An upper capping pattern 272 may be disposed on the bit line 236. Here, the upper capping pattern 272 has sidewalls with on the sidewalls of the bit line 236. The upper spacer 240a may extend upwardly to cover at least portions of the sidewalls of the upper capping pattern 272. As shown in FIG. 6B, the upper spacers 240a may cover whole sidewalls of the upper capping pattern 272.

The upper plate pattern 238 and the upper spacers 240a may be made of ferromagnetic materials. For example, the upper plate pattern 238 and the upper spacer 240a may be made of single films such as NiFe, CoFe, and/or CoFeB, and/or composite films thereof. Here, the upper plate pattern 23 8 and the upper spacer 240a may be made of identical or different ferromagnetic materials.

The upper capping pattern 272 includes at least a second insulation pattern 270. For example, the second insulation pattern 270 may be made of a single film such as a silicon oxide film, a silicon nitride film, and/or a silicon oxynitride film, and/or a composite film thereof. Exemplary silicon oxide films used as the second insulation pattern 270 may include plasma-TEOS, USG, PSG, BPSG, HTO and/or MTO.

The upper capping pattern 272 may further include a second mask pattern 271 stacked on the second insulation pattern 270. The second mask pattern 271 may be made of a material having an etch selection ratio with respect to the upper plate pattern 238 and/or the upper spacer 240a. Especially, the second mask pattern 271 may be made of a material having an etch selection ratio with respect to the upper plate pattern 238 and/or the upper spacer 240a in sputtering etching. For example, the second mask pattern 271 may be made of a single film such as Ti, Ta, TiN, TaN, TaN, and/or Al, and/or a composite film thereof.

The magnetic focusing unit may include only the lower magnetic focusing unit 212. In this case, the upper capping pattern 272 on the bit line 236 may be omitted. In an alternative, the magnetic focusing unit may include only the upper magnetic focusing unit 242. In this case, the lower capping pattern 252 on the digit line 208 may be omitted. In another alternative, the magnetic focusing unit may include both the lower and upper magnetic focusing units 212 and 242. Here, the lower and upper capping patterns 252 and 272 may be disposed on the digit line 208 and the bit line 236, respectively.

Each of the digit line 208 and the bit line 236 may include a metal having a relatively low specific resistance that may be patterned. For example, the digit line 208 and/or the bit line 236 may include Al layers and/or Al alloy layers.

In the above-described magnetic memory device, the magnetic focusing unit may focus the magnetic fields generated from the digit line 208 and/or the bit line 236, thereby allowing a significant reduction of an amount of current supplied to the digit line 208 and/or the bit line 236. As a result, a power consumption of the magnetic memory device may be reduced.

The magnetic focusing unit may also include the spacers 210a and 240a disposed on both walls of the digit line 208 and the bit line 236. It means that the lines 208 and 236 may be formed according to the patterning process. Accordingly, production efficiency for the magnetic memory device may thus be improved.

Moreover, the lower and/or upper spacers 210a and 240a may sufficiently cover sidewalls of the digit line 208 and/or the bit line 236 due to the lower and/or upper capping patterns 252 and 272. That is, even if the spacers 210a and 240a are over-etched, the spacers 210a and 240a may obtain sufficient height due to the capping patterns 252 and 272. As a result, the spacers 210a and 240a may sufficiently cover the sidewalls of the digit line 208 and/or the bit line 236, so that the magnetic focusing unit may completely focus magnetic fields of the digit line 208 and/or the bit line 236.

FIGS. 7A to 10A are cross-sectional views illustrating steps of a method for forming the magnetic memory device of FIG. 6A, and FIGS. 7B to 10B are cross-sectional views taken along lines IV-IV' of FIGS. 7A to 10A, respectively.

Figure 7A:
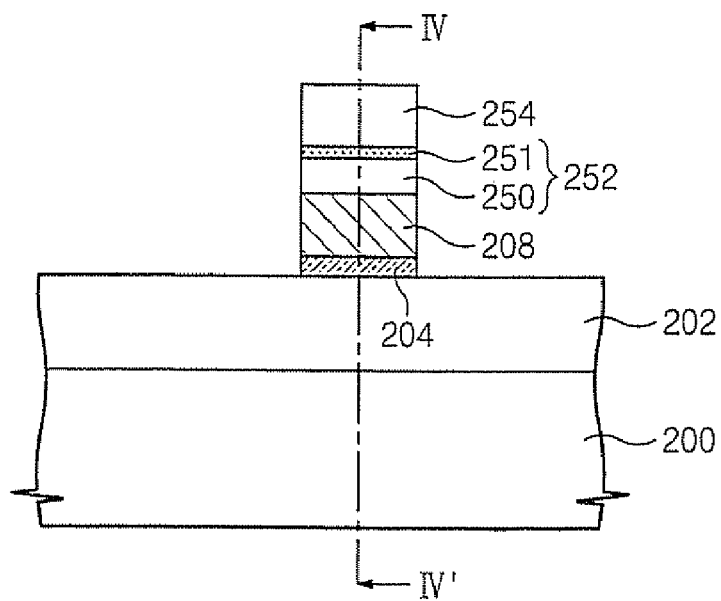
Figure 7B:
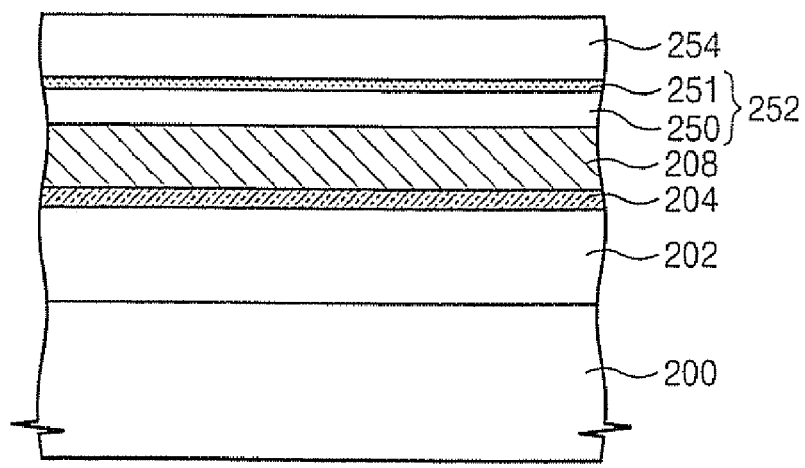
Figure 8A:
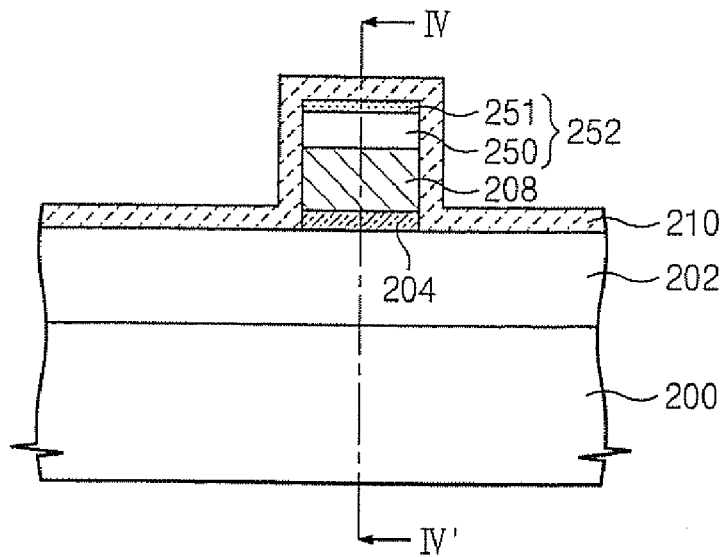
Figure 8B:
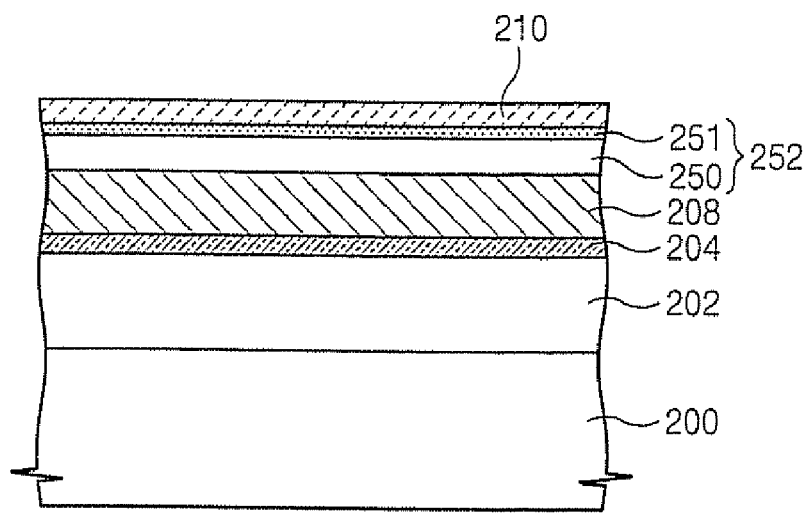

Referring to FIGS. 7A and 7B, a lower insulation film 202 is formed on a substrate 200, and a first ferromagnetic film, a first conductive film and a lower capping film are sequentially formed on the lower insulation film 202. The lower capping film may include a first insulation film and a first mask film that are sequentially stacked. A first photoresist film pattern 254 may be formed in a predetermined region of the lower capping film.

A lower plate pattern 204, a digit line 208, and a lower capping pattern 252 may be formed by consecutively etching the lower capping film, the first conductive film and the first ferromagnetic film using the first photoresist film pattern 254 as an etch mask. The lower capping pattern 252 may include a first insulation pattern 250 and a first mask pattern 251 that are sequentially stacked. The lower plate pattern 204 may be patterned from the first ferromagnetic film, and the digit line 208 may be patterned from the first conductive film. The first ferromagnetic film may be etched by sputtering etching. The first conductive film may include a metal layer having a relatively low specific resistance that may be patterned. For example, the first conductive film may include an Al layer and/or an Al alloy layer.

The first insulation pattern 250 may be a single film such as a silicon oxide film, a silicon nitride film, and/or a silicon oxynitride film, and/or a composite film thereof. Silicon oxide films used as the first insulation pattern 250 may include at least one of plasma-TEOS (plasma enhanced tetraethyl orthosilicate oxide), USG (undoped silicon glass), PSG (phosphorus-doped silicon glass), BPSG (boron/phosphorus-doped silicon glass), HTO (high temperature oxide), and/or MTO (medium temperature oxide). The first mask pattern 251 may comprise a material having an etch selection ratio with respect to the lower plate pattern 204. More particularly, the first mask pattern 251 may be a layer of a material having an etch selection ratio with respect to the lower plate pattern 204 in sputtering etching. Accordingly, in the patterning process, the first insulation pattern 250, the digit line 208 and the lower plate pattern 204 may be protected by the first mask pattern 251 as well as the first photoresist film pattern 254. Thereafter, the first photoresist film pattern 254 may be removed.

The lower plate pattern 204, the digit line 208 and the lower capping pattern 252 may be patterned in a different way. In greater detail, the digit line 208 and the lower capping pattern 252 may be formed by consecutively patterning the lower capping film and the first conductive film using the first photoresist film pattern 254 as a mask. A top surface of the lower capping pattern 252, namely, the top surface of the first mask pattern 251 may be exposed by removing the first photoresist film pattern 254. The lower plate pattern 204 may be formed by etching the first ferromagnetic film by using the first mask pattern 251 as a mask.

As shown in FIGS. 8A, 8B, 9A and 9B, a lower spacer film 210 may be conformally formed on the substrate 200 from which the first photoresist film pattern 254 has been removed to cover the lower plate pattern 204, the digit line 208, and the lower capping pattern 252. The first mask pattern 251 may be made of a material having an etch selection ratio with respect to the lower spacer film 210. More particularly, the first mask pattern 251 may comprise a material having an etch selection ratio with respect to the lower spacer film 210 in sputtering etching. For example, the first mask pattern 251 may comprise a single film such as Ti, Ta, TiN, TaN, TaN, and/or Al, and/or a composite film thereof.

Figure 9A:
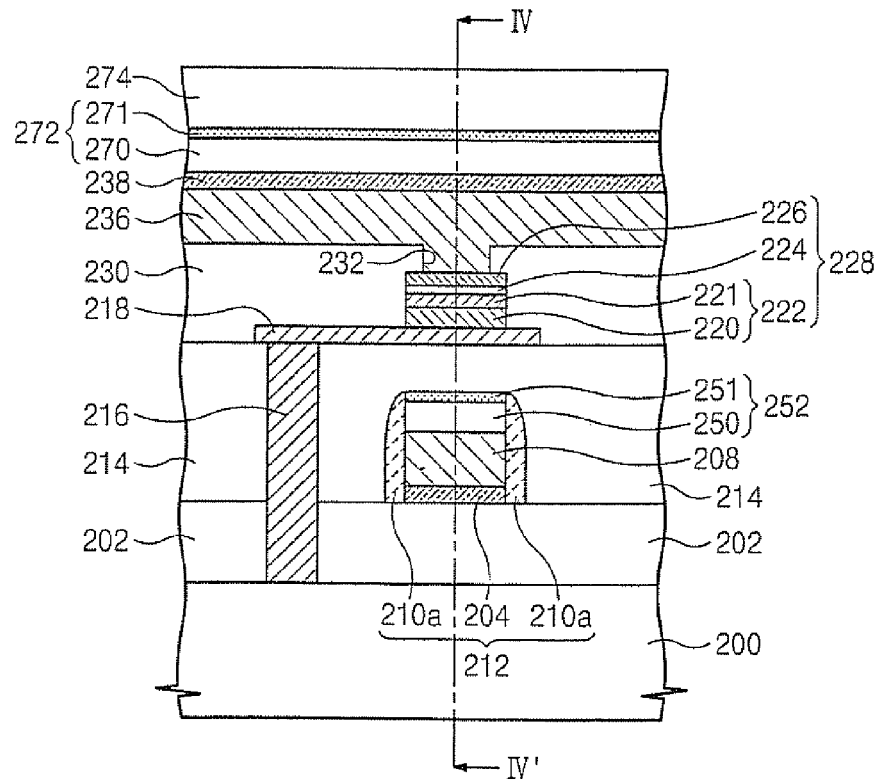

Lower spacers 210a may be formed on both sidewalls of the lower plate pattern 204, the digit line 208, and the lower capping pattern 252 by anisotropic-etching the lower spacer film 210 to expose the first mask pattern 251, as shown in FIG. 9A. Here, the anisotropic etching may be sputtering etching. The lower spacers 210a and the lower plate pattern 204 may provide a lower magnetic focusing unit 212.

The lower spacers 210a may sufficiently cover both sidewalls of the digit line 208 due to the lower capping pattern 252. That is, the lower spacers 210a may have sufficient height by controlling a thickness of the lower capping pattern 252 (especially, a thickness of the first insulation pattern 250). Even if the lower spacer 210a is over-etched in anisotropic etching, the lower spacer 210a may sufficiently cover sidewalls of the digit line 208. More particularly, the lower spacer 210a may be formed to cover at least portions of sidewalls of the lower capping pattern 252, so that both sidewalls of the digit line 208 may be completely covered by the lower spacer 210a.

When the first mask pattern 251 comprises a conductive material, a process for selectively removing the first mask pattern 251 may be performed after forming the lower spacers 210a.

Figure 9B:
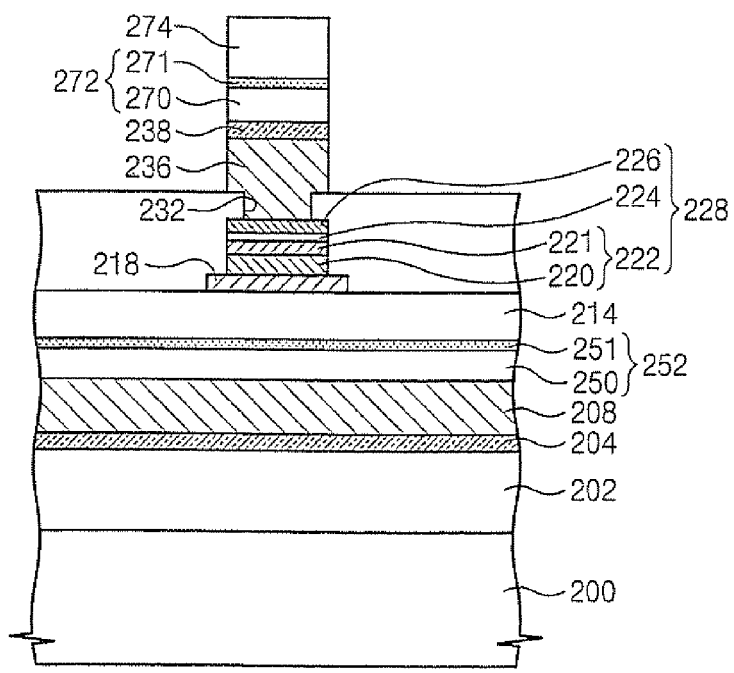

Referring to FIGS. 9A and 9B, an intermediate insulation film 214 may be formed to cover an entire surface of the resulting structure. A conductive plug 216 may be formed at one side of the digit line 208 passing through the intermediate and lower insulation films 214. Accordingly, the conductive plug 216 may contact a predetermined region of the substrate 200.

An electrode 218 electrically connected to the conductive plug 216 may be formed on the intermediate insulation film 214, and an MTJ memory cell 228 may be formed on the electrode 218. The MTJ memory cell 228 may be disposed at the upper portion of the digit line 208. The MTJ memory cell 228 may include a lower pattern 222, a tunnel barrier pattern 224, and an upper pattern 226 that are sequentially stacked. The lower pattern 222 may include a pinning pattern 220 and a pinned pattern 221 that are sequentially stacked.

An upper insulation film 230 may be formed to cover an entire surface of the resulting structure. The top surface of the upper insulation film 230 may be leveled. A contact hole 232 exposing the MTJ memory cell 228 may be formed by patterning the upper insulation film 230.

A second conductive film may be formed to fill the contact hole 232, and a second ferromagnetic film and an upper capping film may be sequentially formed on the second conductive film. More particularly, the upper capping film may include a second insulation layer and a second mask layer that are sequentially stacked.

A second photoresist film pattern 274 may be formed at a predetermined region of the upper capping film. A bit line 236, an upper plate pattern 238, and an upper capping pattern 272 that are sequentially stacked may be formed by consecutively patterning the upper capping film, the second ferromagnetic film, and the second conductive film using the second photoresist film as a mask. The second ferromagnetic film may be etched by sputtering etching. The upper capping pattern 272 may include a second insulation pattern 270 and a second mask pattern 271 that are sequentially stacked. The bit line 236 may be patterned from the second conductive film, and the upper plate pattern 238 may be patterned from the second ferromagnetic film.

In particular, the second conductive film may include a metal layer having a relatively low specific resistance that may be patterned. For example, the second conductive film may include an Al layer and/or an Al alloy layer.

The second insulation pattern 270 may comprise a single layer such as a silicon oxide film, a silicon nitride film, and/or a silicon oxynitride film, and/or a composite layer thereof. Silicon oxide films used as the second insulation pattern 270 may include one or more of plasma-TEOS, USG, PSG, BPSG, HTO, and/or MTO. The second mask pattern 271 may comprise a material having an etch selection ratio with respect to the upper plate pattern 238. More particularly, the second mask pattern 271 may comprise a material having an etch selection ratio with respect to the upper plate pattern 238 in sputtering etching. Accordingly, in the patterning process, the second insulation pattern 270 may be protected by the second mask pattern 271 as well as the second photoresist film pattern 274. Thereafter, the second photoresist film pattern 274 may be removed.

The bit line 236, the upper plate pattern 238 and the upper capping pattern 272 may be formed in other ways. For example, the upper capping pattern 272 may be formed by patterning the upper capping film using the second photoresist film pattern 274 as a mask. The top surface of the upper capping pattern 272 is exposed by removing the second photoresist film pattern 274. The bit line 236 and the upper plate pattern 238 may be formed by etching the second ferromagnetic film and the second conductive film using the second capping pattern 272 as a mask. In the event that the second conductive film includes a bonding layer (for example, a layer of Ti and/or Ta) and a conductive barrier layer at the lower and/or upper portions of the metal layer, while the second conductive film is etched, the second mask pattern 271 may be removed.

Figure 10A:
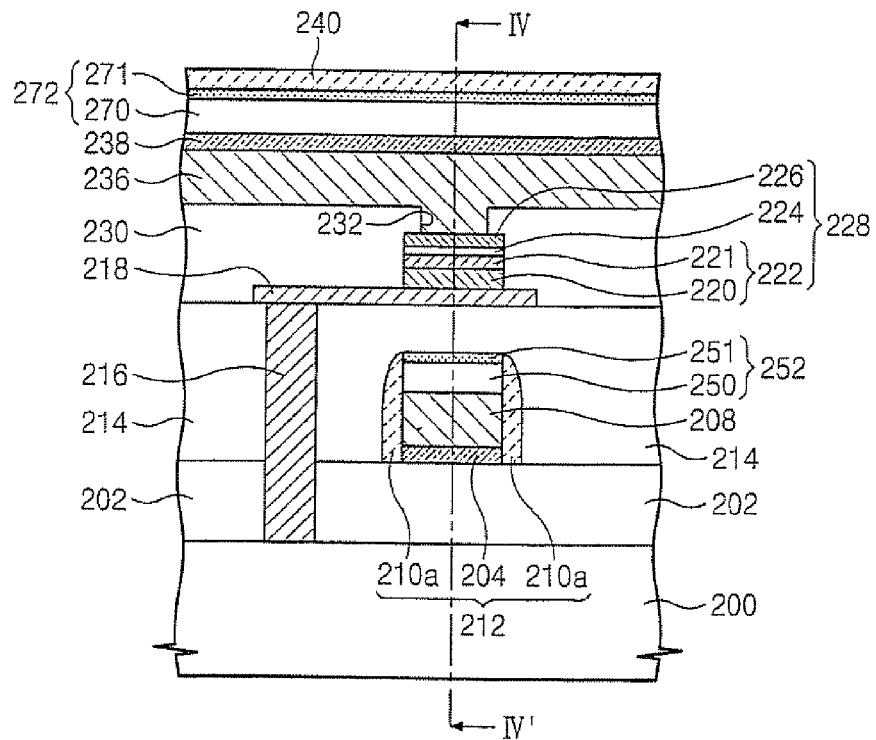
Figure 10B:
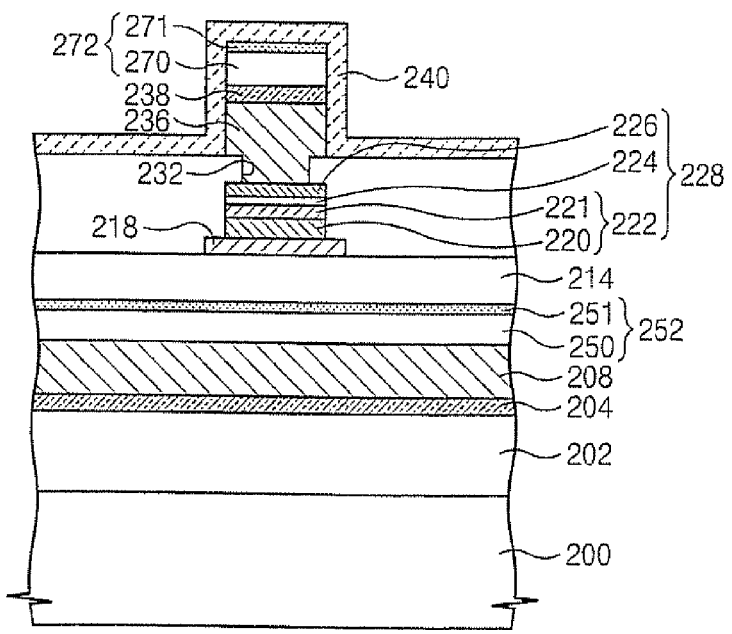

As depicted in FIGS. 10A and 10B, an upper spacer film 240 may be conformally formed on the substrate 200 from which the second photoresist film pattern 274 has been removed to cover the bit line 236, the upper plate pattern 238, and the upper capping pattern 272. The upper spacer film 240 may comprise a ferromagnetic film. More particularly, the second mask pattern 271 may comprise a material having an etch selection ratio with respect to the upper spacer film 240. The second mask pattern 271 may comprise a material having an etch selection ratio with respect to the upper spacer film 240 in sputtering etching. For example, the second mask pattern 271 may comprise a single layer such as Ti, Ta, TiN, TaN, TaN, and/or Al, and/or a composite layer thereof.

The upper spacers 240a of FIG. 6B may be formed on both sidewalls of the bit line 236, the upper plate pattern 238, and the upper capping pattern 272 by anisotropic-etching the upper spacer film 240 to expose the upper capping pattern 272, namely the second mask pattern 271. Here, the upper spacer film 240 may be anisotropic-etched by sputtering etching.

In the event that the second mask pattern 274 is removed before forming the upper spacer film 240, the upper spacers 240a may be formed by anisotropic-etching the upper spacer film 240 to expose the second insulation pattern 270. Here, the second insulation pattern 270 may be more or less etched. By forming the second insulation pattern 270 sufficiently thick, sidewalls of the bit line 236 and the upper plate pattern 238 may remain covered by the spacers 240a even if over-etching occurs during forming thereof.

The upper plate pattern 238 and the upper spacers 240a may provide an upper magnetic focusing unit 242 of FIG. 6B.

The upper spacers 240a may sufficiently cover both sidewalls of the bit line 236 even if over-etching occurs by providing a sufficiently thick upper capping pattern 272. That is, the upper spacers 240a may have sufficient height by controlling a thickness of the upper capping pattern 272, especially, a thickness of the second insulation pattern 270. Even if the upper spacer 240a is over-etched in anisotropic etching, the upper spacers 240a may sufficiently cover the sidewalls of the bit tine 236. In particular, the upper spacer 240a may be formed to cover at least portions of the sidewalls of the upper capping pattern 272, so that both sidewalls of the bit line 236 may be completely covered by the upper spacers 240a.

The lower and/or upper magnetic focusing units 212 and 242 may be included in the magnetic focusing unit. Forming the magnetic memory device may include at least one of forming the lower and/or upper magnetic focusing units 212 and/or 242. More particularly, forming the magnetic memory device may include forming both the lower and upper magnetic focusing units 212 and 242.

In forming the magnetic memory device, the digit line 208 and/or the bit line 236 may be formed according to a patterning process reducing a unit cost of production, thereby improving productivity of the magnetic memory device.

A height of the spacers 210a and/or 240a may be controlled by the lower and/or upper capping patterns 252 and/or 272. Accordingly, even if the spacers 210a and/or 240a are over-etched, the spacers 210a and/or 240a may sufficiently cover sidewalls of the lines 208 and/or 236. As a result, magnetic fields generated from the digit line 208 and/or the bit line 236 may be efficiently focused to reduce power consumption of the magnetic memory device.

In first and second embodiments of the present invention discussed above with respect to FIGS. 2A-10B, corresponding elements may comprise identical materials. That is, elements of second embodiments discussed above with respect to FIGS. 6A-10B which have not been explained in detail may comprise the same materials as those of corresponding elements of the first embodiments discussed above with respect to FIGS. 2A-5B.

As discussed above, in accordance with embodiments of the present invention, a magnetic memory device may include a magnetic focusing unit for focusing magnetic fields generated from the digit line and/or the bit line. The magnetic focusing unit may reduce power consumption of the magnetic memory device.

In addition, the magnetic focusing unit may include lower and upper spacers formed on both sidewalls of the digit line and the bit line respectively. A unit cost of production of the digit line and the bit line may be reduced, and the magnetic focusing unit may be formed relatively easily. As a result, production efficiency for the magnetic memory device may be improved.

Furthermore, the lower and upper capping patterns may be disposed on the digit line and the bit line. The lower and upper spacers may have sufficient height due to the lower and upper capping patterns. Even if the lower and upper spacers are over-etched, the lower and upper spacers may sufficiently cover both sidewalls of the digit line and the bit line. Accordingly, magnetic fields generated from the digit line and the bit line may be efficiently focused to reduce power consumption of the magnetic memory device.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A method of forming a magnetic memory device, the method comprising:
    forming a digit line on a substrate and forming a capping pattern on the digit line so that the digit line is between the capping pattern and the substrate;
    forming a conformal ferromagnetic layer on sidewalls of the digit line and on sidewalls of the capping pattern;
    anisotropic etching the conformal ferromagnetic layer to form a ferromagnetic spacer on sidewalls of the digit line and on sidewalls of the capping pattern, wherein the capping pattern includes an insulation pattern and a mask pattern on the insulation pattern, and wherein the mask pattern comprises a layer of a metal-containing material having an etch selection ratio with respect to the ferromagnetic spacer;
    forming a first insulating layer covering the digit line, the capping pattern and the ferromagnetic spacer;
    forming a magnetic tunnel junction pattern (MTJ pattern) on the first insulating layer so that the first insulating layer is between the MTJ pattern and the capping pattern and so that portions of the digit line and the capping pattern are aligned between the MTJ pattern and the substrate in a direction perpendicular with respect to a surface of the substrate;
    forming a second insulating layer covering the first insulating layer and MTJ pattern; and
    forming a bit line on the second insulating layer, wherein the bit line is electrically connected to the MTJ pattern.

2. The method according to claim 1, further comprising:
    forming a ferromagnetic plate between the digit line and the substrate,
    wherein the ferromagnetic spacer is also formed on a sidewall of the ferromagnetic plate.

3. The method according to claim 1, further comprising: forming an upper ferromagnetic spacer on a sidewall of the bit line.

4. The method according to claim 3, further comprising:
    forming a ferromagnetic plate on the bit line,
    wherein the upper ferromagnetic spacer is also formed on a sidewall of the ferromagnetic plate.

5. The method according to claim 3, further comprising:
    forming an upper capping pattern on the bit line so that the bit line is between the upper capping pattern and the substrate,
    wherein the upper ferromagnetic spacer is also formed on at least a portion of a sidewall of the upper capping pattern,
    wherein the upper capping pattern includes an upper insulation pattern and an upper mask pattern stacked on the upper insulation pattern, and
    wherein the upper mask pattern comprises a layer of a metal-containing material having an etch selection ratio with respect to the upper ferromagnetic spacer.

6. The method according to claim 5, wherein the upper mask pattern comprises a layer of at least one selected from the group consisting of Ti, Ta, TiN, TaN and Al.

7. The method according to claim 5, wherein the upper insulation pattern comprises a layer of at least one selected from the group consisting of silicon oxide, silicon nitride and silicon oxynitride.

8. The method according to claim 5, further comprising:
    forming a ferromagnetic plate between the substrate and the digit line; and
    forming an upper ferromagnetic plate between the upper capping pattern and the bit line, wherein the ferromagnetic spacer is also formed on a sidewall of the ferromagnetic plate, and the upper ferromagnetic spacer is also formed on a sidewall of the upper ferromagnetic plate.

9. The method according to claim 5, further comprising:
removing the upper mask pattern after forming the upper ferromagnetic spacer.

10. The method according to claim 5, further comprising:
removing the mask pattern after forming the ferromagnetic spacer; and
removing the upper mask pattern after forming the upper ferromagnetic spacer.

11. A method of forming a magnetic memory device, the method comprising:
forming a digit line on the substrate;
forming a first insulating layer on the digit line;
forming a magnetic tunnel junction pattern (MTJ pattern) on the first insulating layer so that the first insulating layer is between the digit line and the MTJ pattern;
forming a second insulating layer on the MTJ pattern and on the first insulating layer;
forming a bit line, a ferromagnetic plate, and a capping pattern sequentially stacked on the second insulating layer so that the bit line is between the capping pattern and the substrate, so that the bit line is electrically connected to the MTJ pattern, and so that the ferromagnetic plate is between the capping pattern and the bit line;
forming a conformal ferromagnetic layer on sidewalls of the bit line and on sidewalls of the capping pattern; and
anisotropic etching the conformal ferromagnetic layer to form a ferromagnetic spacer on sidewalls of the bit line and on sidewalls of the capping pattern,
wherein the capping pattern includes an insulation pattern and a mask pattern stacked on the insulation pattern, and wherein the mask pattern comprises a layer of a metal-containing material having an etch selection ratio with respect to the ferromagnetic spacer, and
wherein the ferromagnetic spacer is formed on a sidewall of the ferromagnetic plate.

12. The method according to claim 11, further comprising:
forming a lower ferromagnetic plate between the digit line and the substrate; and
forming a lower ferromagnetic spacer on sidewalls of the lower ferromagnetic plate and the digit line.

13. The method according to claim 1, further comprising:
removing the mask pattern after forming the ferromagnetic spacer.

14. The method according to claim 11, further comprising:
removing the mask pattern after forming the ferromagnetic spacer.

* * * * *